United States Patent
Zhang (10) Patent No.: US 11,693,584 B2
(45) Date of Patent: Jul. 4, 2023

(54) WORD LINE CONTROL METHOD, WORD LINE CONTROL CIRCUIT DEVICE AND SEMICONDUCTOR MEMORY

(71) Applicant: Changxin Memory Technologies, Inc., Anhui (CN)

(72) Inventor: Liang Zhang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 234 days.

(21) Appl. No.: 17/171,307

(22) Filed: Feb. 9, 2021

(65) Prior Publication Data

US 2021/0165602 A1    Jun. 3, 2021

Related U.S. Application Data

(63) Continuation of application No. PCT/CN2019/116063, filed on Nov. 6, 2019.

(30) Foreign Application Priority Data

Nov. 14, 2018  (CN) .......................... 201811351053.2
Nov. 14, 2018  (CN) .......................... 201821876360.8

(51) Int. Cl.
*G06F 3/00*    (2006.01)
*G06F 3/06*    (2006.01)
(Continued)

(52) U.S. Cl.
CPC .......... *G06F 3/0655* (2013.01); *G06F 3/0604* (2013.01); *G06F 3/0679* (2013.01);
(Continued)

(58) Field of Classification Search
CPC .... G06F 3/0604; G06F 3/0655; G06F 3/0679; G11C 2029/1202; G11C 29/18;
(Continued)

(56) References Cited

U.S. PATENT DOCUMENTS 5,831,925 A * 11/1998 Brown ................. G11C 7/1045
                                                    365/189.08
2014/0254285 A1    9/2014 Eguchi et al.
(Continued)

FOREIGN PATENT DOCUMENTS

CN    102760496 A    10/2012
CN    208834750 U    5/2019

OTHER PUBLICATIONS

PCT International Search Report and the Written Opinion dated Feb. 6, 2020, issued in related International Application No. PCT/CN2019/116063 (7 pages).

*Primary Examiner* — Thong Q Le
(74) *Attorney, Agent, or Firm* — Sheppard Mullin Richter & Hampton (57) ABSTRACT

A word line control method, a word line control circuit device, and a semiconductor memory are provided. The method includes: acquiring a row address input signal; acquiring a test mode signal; performing logical and decoding operations on the row address input signal and the test mode signal to generate a row address control signal, wherein the row address control signal includes at least two valid activation signals; and simultaneously activating at least two non-adjacent word lines based on the at least two valid activation signals. The row address control signal obtained allows simultaneous activation of at least two non-adjacent word lines. Since none of any two non-adjacent word lines share a common contact area, a test will not be affected by the disconnection of a contact area or the presence of high impedance, thus improving test accuracy.

10 Claims, 6 Drawing Sheets

(51) Int. Cl.
*G11C 29/02* (2006.01)
*G11C 29/14* (2006.01)
*G11C 29/18* (2006.01)
*G11C 29/46* (2006.01)
*G11C 29/12* (2006.01)

(52) U.S. Cl.
CPC ............ *G11C 29/025* (2013.01); *G11C 29/14* (2013.01); *G11C 29/18* (2013.01); *G11C 29/46* (2013.01); *G11C 2029/1202* (2013.01); *G11C 2029/1802* (2013.01)

(58) Field of Classification Search
CPC .......... G11C 2029/1802; G11C 29/025; G11C 29/12; G11C 29/14; G11C 29/46; G11C 11/406; G11C 11/40615; G11C 13/0007; G11C 13/0026; G11C 13/0028; G11C 13/0038; G11C 13/0064; G11C 13/0069; G11C 2013/0073; G11C 2013/0083; G11C 29/12015; G11C 29/48; G11C 29/50; G11C 29/50016; G11C 7/1045; G11C 8/12
USPC ............. 365/189.08, 230.03, 230.06, 230.08
See application file for complete search history.

(56) References Cited

U.S. PATENT DOCUMENTS

| | | |
|---|---|---|
| 2015/0043292 A1 | 2/2015 | Lee et al. |
| 2017/0047113 A1 | 2/2017 | Kim et al. |

\* cited by examiner

WORD LINE CONTROL METHOD, WORD LINE CONTROL CIRCUIT DEVICE AND SEMICONDUCTOR MEMORY

CROSS-REFERENCE TO RELATED APPLICATIONS

This application is a continuation application of International Patent Application No. PCT/CN2019/116063, filed on Nov. 6, 2019, which is based on and claims priority of the Chinese Patent Applications No. 201811351053.2 and No. 201821876360.8, both filed on Nov. 14, 2018. The above-referenced applications are incorporated herein by reference in its entirety.

TECHNICAL FIELD

The present invention relates generally to the field of semiconductor integrated circuit (IC) technologies, and more specifically, to a word line control method, a word line control circuit device and a semiconductor memory.

BACKGROUND

A finished memory chip usually has some defects, such as low storage capacitance, wherein the capacitance of each storage capacitor may be half of that of a standard storage capacitor, or disconnection of contact area or presence of high impedance between storage capacitors. Those skilled in the art usually resort to certain tests to identify those defects. For example, in order to determine whether the capacitance of a storage capacitor is low, the current common practice is to simultaneously activate two capacitors by activating two adjacent word lines each connecting to the respective one of the two capacitors. If the measured capacitance is equal to the standard storage capacitance, it can be determined that both of the two storage capacitors are defective with low capacitance. To simultaneously activate two adjacent word lines is based on the consideration that tests can still be completed in case of the malfunction of one of the two word lines. Thus, if the measured capacitance is lower than the standard storage capacitance, it can be determined that one of the storage capacitors is defective with low capacitance.

However, the abovementioned approach is not perfect in identifying low storage capacitance. Since two adjacent storage capacitors share a same contact area, once the contact area malfunctions, it is no longer possible to ascertain whether the storage capacitors are defective with low capacitance by activating either one or both of the word lines.

It is to be noted that the information disclosed in this Background section is only for providing a better understanding of the background or context of the present invention, and therefore may contain information that does not form the prior art that is already known to a person of ordinary skill in the art.

SUMMARY

The present invention provides a word line control method, a word line control circuit device, and a semiconductor memory, to overcome or mitigate one or more of the problems described in the Background section.

In one aspect, an embodiment of the present invention provides a word line control method. The word line control method may comprise: acquiring a row address input signal; performing logical and decoding operations on the row address input signal to generate a row address control signal; and simultaneously activating at least two non-adjacent word lines based on the at least two valid activation signals. The row address control signal may include at least two valid activation signals.

In some embodiments, the aforementioned method may further comprise: acquiring a test mode signal. Performing logical and decoding operations on the row address input signal to generate a row address control signal may comprise: performing the logical and decoding operations on the row address input signal and the test mode signal to generate the row address control signal.

In some embodiments, the row address input signal may include a plurality of row address signals. Performing logical and decoding operations on the row address input signal and the test mode signal to generate a row address control signal may comprise: performing an inverse operation on the test mode signal to generate an inverted test signal; selecting one of the plurality of row address signals, and performing a NAND operation on the selected row address signal and the inverted test signal to generate an inverted output row address; performing inverse operations on all the row address signals to generate corresponding inverted row address signals; performing a NAND operation on the inverted row address signal corresponding to the selected row address signal and the inverted test signal to generate a non-inverted output row address; and decoding the inverted output row address, the non-inverted output row address, unselected row address signals and unselected inverted row address signals to obtain the row address control signal.

In some embodiments, decoding the inverted output row address, the non-inverted output row address, unselected row address signals and unselected inverted row address signals to obtain the row address control signal may comprise: performing a primary decoding process on the inverted output row address, the non-inverted output row address, the unselected row address signals and the unselected inverted row address signals to obtain a first row address control signal; and performing a secondary decoding process on the first row address control signal to obtain a second row address control signal, configured for simultaneously activating the at least two non-adjacent word lines. The first row address control signal may include the at least two valid activation signals, configured for simultaneously activating the at least two non-adjacent word lines.

In a second aspect, an embodiment of the present invention provides a word line control circuit device. The word line control circuit device may comprise a test mode input circuit, a row address input circuit, and a logic decoding processor. The test mode input circuit may have an output coupled, together with an output of the row address input circuit, to a signal input of the logic decoding processor. The logic decoding processor may have a signal output coupled to a plurality of word lines in a memory array. The test mode input circuit may be configured to receive a test mode signal. The row address input circuit may be configured to receive a plurality of row address signals, and the logic decoding processor may be configured to perform logical and decoding operations on the plurality of row address signals and the test mode signal to generate a row address control signal. The row address control signal may include at least two valid activation signals, configured for simultaneously activating at least two non-adjacent word lines.

In some embodiments, the test mode input circuit may comprise a test mode input, a first inverter, and a test mode output. The test mode input may be configured to receive the test mode signal. The first inverter may be configured to perform an inverse operation on the test mode signal to generate an inverted test signal. The test mode output may be configured to output the inverted test signal.

In some embodiments, the row address input circuit may comprise a plurality of row address signal lines, and a plurality of second inverters coupled to the corresponding one of the row address signal lines, respectively. Each of the row address signal lines may be configured to receive the corresponding one of the row address signals from the row address input signal, respectively. The second inverters may be configured to perform inverse operations on the row address signals to generate a plurality of inverted row address signals.

In some embodiments, the logic decoding processor may comprise a first NAND gate, a second NAND gate, and a decoding device. The first NAND gate may be configured to perform a NAND operation on the selected one of the row address signals and the inverted test signal to generate an inverted output row address. The first NAND gate may include a first input coupled to the one of the row address signal lines corresponding to the selected row address signal, a second input coupled to the test mode output and configured to receive the inverted test signal, and a first output. The second NAND gate may be configured to perform a NAND operation on one of the inverted row address signals corresponding to the selected row address signal and the inverted test signal to generate a non-inverted output row address. The second NAND gate may include a third input coupled to an output of one of the second inverters corresponding to the selected row address signal, a fourth input coupled to the test mode output, and a second output. The decoding device may be configured to decode the inverted output row address, non-inverted output row address, unselected row address signals and unselected inverted row address signals to obtain the row address control signal. The row address control signal may include the at least two valid activation signals, configured for simultaneously activating at least two non-adjacent word lines.

In some embodiments, the decoding device may comprise a first decoder. The first decoder may have a set of non-inverted inputs and a set of inverted inputs. The first output may be coupled to a corresponding one of the inverted inputs, and the second output may be coupled to a corresponding one of the non-inverted inputs.

In some embodiments, the decoding device may further comprise a second decoder and a third decoder. The second decoder may have a set of non-inverted inputs configured for receiving the unselected row address signals, and a set of inverted inputs configured for receiving the unselected inverted row address signals. The third decoder may have a set of non-inverted inputs configured for receiving the unselected row address signals, and a set of inverted inputs configured for receiving the unselected inverted row address signals.

In some embodiments, the decoding device may further comprise a fourth decoder. The fourth decoder may have inputs coupled to the output of the first decoder, the second decoder and the third decoder. The inputs of the first decoder, the second decoder and the third decoder may constitute the signal input of the logic decoding processor. The fourth decoder may have outputs constituting the signal output of the logic decoding processor that is coupled to the word lines.

The present invention further provides a semiconductor memory. The semiconductor memory may comprise a word line control circuit device. The word line control circuit device may comprise a row address input circuit and a logic decoding processor. The logic decoding processor may have a signal output coupled to a plurality of word lines in a memory array. The row address input circuit may be configured to receive a plurality of row address signals, and the logic decoding processor may be configured to perform logical and decoding operations on the plurality of row address signals to generate a row address control signal. The row address control signal may include at least two valid activation signals, configured for simultaneously activating at least two non-adjacent word lines.

In some embodiments, the word line control circuit device may further comprise a test mode input circuit configured to receive a test mode signal. The logic decoding processor may be configured to perform logical and decoding operations on the plurality of row address signals and the test mode signal to generate the row address control signal. The test mode input circuit may have an output coupled, together with an output of the row address input circuit, to a signal input of the logic decoding processor.

In some embodiments, in the word line control circuit device, the test mode input circuit may comprise a test mode input, a first inverter, and a test mode output. The test mode input may be configured to receive the test mode signal. The first inverter may be configured to perform an inverse operation on the test mode signal to generate an inverted test signal. The test mode output may be configured to output the inverted test signal.

In some embodiments, in the word line control circuit device, the row address input circuit may comprise a plurality of row address signal lines, and a plurality of second inverters coupled to the corresponding one of the row address signal lines, respectively. Each of the row address signal lines may be configured to receive the corresponding one of the row address signals from the row address input signal, respectively. The second inverters may be configured to perform inverse operations on the row address signals to generate a plurality of inverted row address signals.

In some embodiments, in the word line control circuit device, the logic decoding processor may comprise a first NAND gate, a second NAND gate, and a decoding device. The first NAND gate may be configured to perform a NAND operation on the selected one of the row address signals and the inverted test signal to generate an inverted output row address. The first NAND gate may include a first input coupled to the one of the row address signal lines corresponding to the selected row address signal, a second input coupled to the test mode output and configured to receive the inverted test signal, and a first output. The second NAND gate may be configured to perform a NAND operation on one of the inverted row address signals corresponding to the selected row address signal and the inverted test signal to generate a non-inverted output row address. The second NAND gate may include a third input coupled to an output of one of the second inverters corresponding to the selected row address signal, a fourth input coupled to the test mode output, and a second output. The decoding device may be configured to decode the inverted output row address, non-inverted output row address, unselected row address signals and unselected inverted row address signals to obtain the row address control signal. The row address control signal may include the at least two valid activation signals, configured for simultaneously activating at least two non-adjacent word lines.

In some embodiments, in the word line control circuit device, the decoding device may comprise a first decoder. The first decoder may have a set of non-inverted inputs and a set of inverted inputs. The first output may be coupled to a corresponding one of the inverted inputs, and the second output may be coupled to a corresponding one of the non-inverted inputs.

In some embodiments, in the word line control circuit device, the decoding device may further comprise a second decoder and a third decoder. The second decoder may have a set of non-inverted inputs configured for receiving the unselected row address signals, and a set of inverted inputs configured for receiving the unselected inverted row address signals. The third decoder may have a set of non-inverted inputs configured for receiving the unselected row address signals, and a set of inverted inputs configured for receiving the unselected inverted row address signals.

In some embodiments, in the word line control circuit device, the decoding device may further comprise a fourth decoder. The fourth decoder may have inputs coupled to the output of the first decoder, the second decoder and the third decoder. The inputs of the first decoder, the second decoder and the third decoder may constitute the signal input of the logic decoding processor. The fourth decoder may have outputs constituting the signal output of the logic decoding processor that is coupled to the word lines.

The technical solutions provided by the present invention offer the following advantages: the row address control signal obtained, under test mode, from the logical and decoding operations performed on the row address input signal and the test mode signal enable simultaneous activation of at least two non-adjacent word lines. Since none of any two non-adjacent word lines share a common contact area, the tests will not be affected by disconnection of the contact area or presence of high impedance, thus improving test accuracy.

The information disclosed in this Summary section is illustrative only and is not restrictive of the present invention in any way. In addition to the above illustrative aspects, embodiments and features, further aspects, embodiments and features will become readily apparent by reference to the appended drawings and following detailed description.

BRIEF DESCRIPTION OF THE DRAWINGS

Unless otherwise specified, the same reference numbers used throughout the appended drawings refer to the same or analogous components or elements. And the appended drawings are not necessarily drawn to scale. It is to be understood that these appended drawings present only some embodiments of the present invention, and shall not be construed as a limitation to the scope of the present invention.

LIST OF REFERENCE NUMERALS IN DRAWINGS

10: Test Mode Input Circuit; 11: Test Mode Input; 12: Test Mode Output;
20: Row Address Input Circuit; 22: Output of Row Address Input Circuit;
30: Logic Decoding Processor; 40: Word Line;
32: Signal Input of Logic Decoding Processor; 33: Signal Output of Logic Decoding Processor;
201: Row Address Signal Line; 100: First Inverter; 200: Second Inverter;
310: First NAND Gate; 320: Second NAND Gate; 330: Decoding Device;
311: First Input; 312: Second Input; 313: First Output;
321: Third Input; 322: Fourth Input; 323: Second Output;
331: First Decoder; 332: Second Decoder; 333: Third Decoder;
334: Fourth Decoder; 335: Output of First Decoder;
336: Output of Second Decoder; 337: Output of Third Decoder.

DETAILED DESCRIPTION OF THE EMBODIMENTS

Described below are merely certain exemplary embodiments. As will be recognized by those skilled in the art, the embodiments disclosed herein may be modified in various manners without departing from the spirit or scope of the present invention. Accordingly, the appended drawings and description shall be regarded as intrinsically exemplary rather than restrictive.

Although directional and spatial terms such as "central", "longitudinal", "lateral", "lengthwise", "widthwise", "thickness-wise", "upper", "lower", "front", "rear", "left", "right", "vertical", "horizontal", "top", "bottom", "interior", "exterior", "clockwise", "counterclockwise", "axial", "radial", "circumferential", etc. may be used herein to describe a directional and spatial relationship shown in the figures, they are used merely to facilitate and simplify the description of the present invention, and do not indicate or imply the stated components or elements must be arranged, constructed or operated in particular orientations. Therefore, they shall not be construed as limiting the present invention.

In addition, the terms "first", "second", etc. are used herein only for the purpose of illustration, and shall not be construed as indicating or implying relative importance or implicitly indicating the number of technical features indicated. Therefore, a feature described with "first", "second" or the like may include one or more of the features, either explicitly or implicitly. As used herein, the term "a plurality of" has the meaning of "two or more", unless specifically defined otherwise.

In the present invention, unless specifically defined or limited otherwise, the terms "attached", "coupled", "connected", "fixed", or the like shall be construed in a broad sense. For example, it may comprise a fixed connection, a detachable connection, or an integration; or a mechanical connection, an electrical connection, or a communication connection; or a direct connection, or an indirect connection through an intermediate medium; or an internal connection of two components or an interaction of two components. The specific meanings of the above terms in the present invention can be understood by those skilled in the art on a case-by-case basis.

In the present invention, unless defined or limited otherwise, when a first feature is described as being "on" or "under" a second feature, it may be in direct contact with the second feature, or in non-direct contact with the second feature through other features. Moreover, when a first feature is described as being "over", "overlying" or "above" a second feature, it may either be situated normally or obliquely over the second feature, or be located at a horizontal level higher than that of the second feature. Similarly, when a first feature is described as being "under", "underlying" or "beneath" a second feature, it may either be situated normally or obliquely under the second feature, or be located at a horizontal level lower than that of the second feature.

Many different embodiments or examples are provided below for implementing the present invention. Specific examples of components and arrangements are described below to simplify the disclosure of the present invention. These are merely embodiments and examples, and are not intended to limit the scope of the present invention. In addition, the present invention may repeat reference numerals and/or letters in various embodiments. This repetition is for the purpose of simplicity and clarity, and does not in itself dictate a relationship between the various embodiments and/or configurations discussed. Further, although the present invention provides examples of various particular processes and materials, those of ordinary skill in the art will recognize the use of other processes and/or materials.

Embodiment 1

Figure 1:
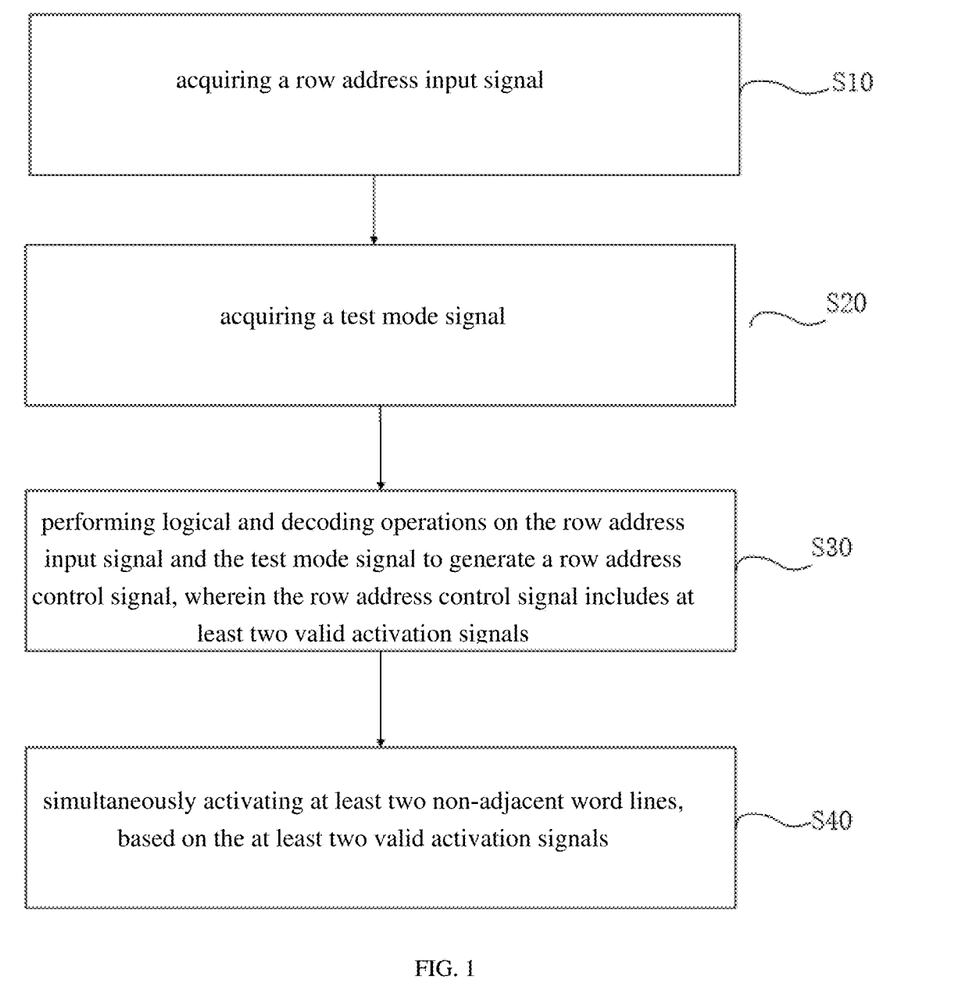
FIG. 1 is a schematic flowchart of a word line control method in accordance with one embodiment of the present invention.

Referring to FIG. 1, one embodiment of the present invention provides a word line control method. The word line control method may comprise the following steps.

In step S10, a row address input signal may be acquired.

In step S20, a test mode signal may be acquired.

In step S30, logical and decoding operations may be performed on the row address input signal and the test mode signal to generate a row address control signal. The row address control signal may include at least two valid activation signals.

In step S40, at least two non-adjacent word lines may be simultaneously activated based on the at least two valid activation signals.

Figure 2:
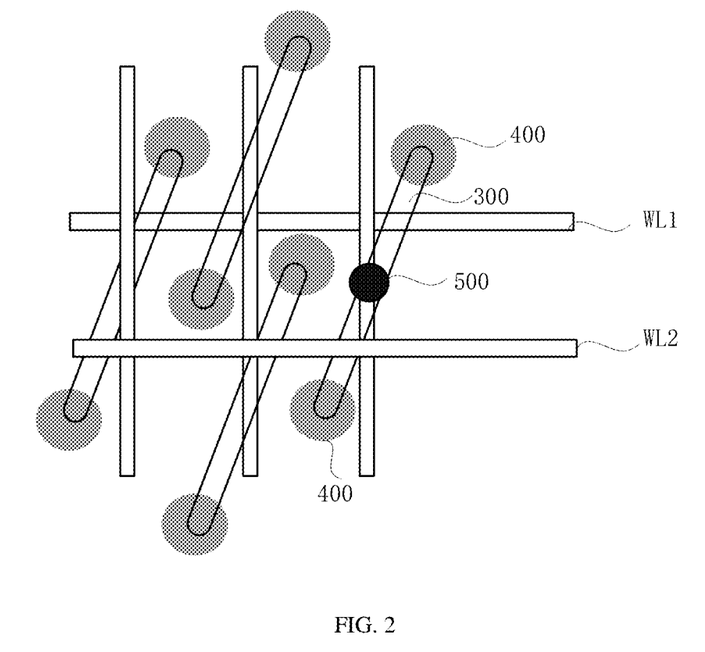
FIG. 2 is a schematic diagram showing a structure of the word lines in accordance with prior arts.
Figure 3:
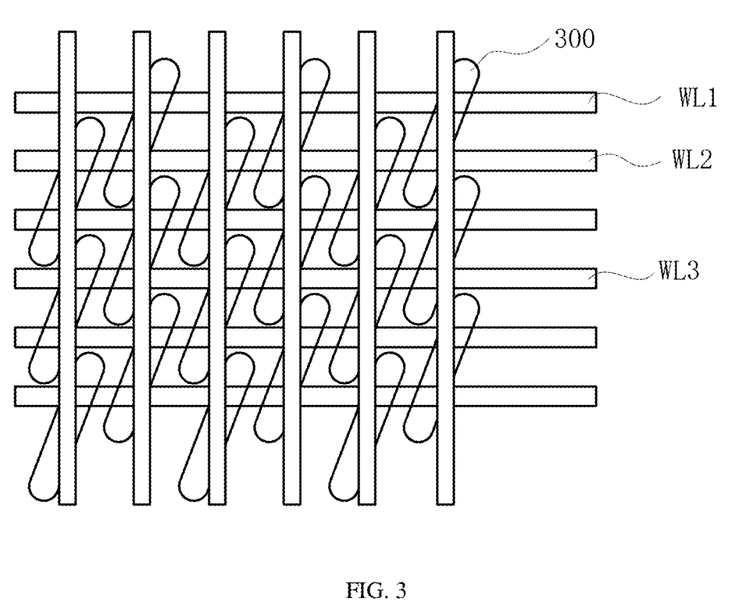
FIG. 3 is a schematic diagram showing a structure of the word lines in accordance with one embodiment of the present invention.

The row address control signal obtained, under test mode, from the logical and decoding operations performed on the row address input signal and the test mode signal enable simultaneous activation of at least two non-adjacent word lines. Referring to FIG. 2, two storage capacitors 400 electrically coupled to sources of respective access transistors share a common active area 300, while two adjacent word lines share a common contact area 500 serving as a drain. Referring to FIG. 3, since two non-adjacent word lines, for example WL1 and WL3, do not share a common contact area 500, the tests will not be affected by disconnection of contact area 500 or presence of high impedance, thus improving test accuracy.

Figure 4:
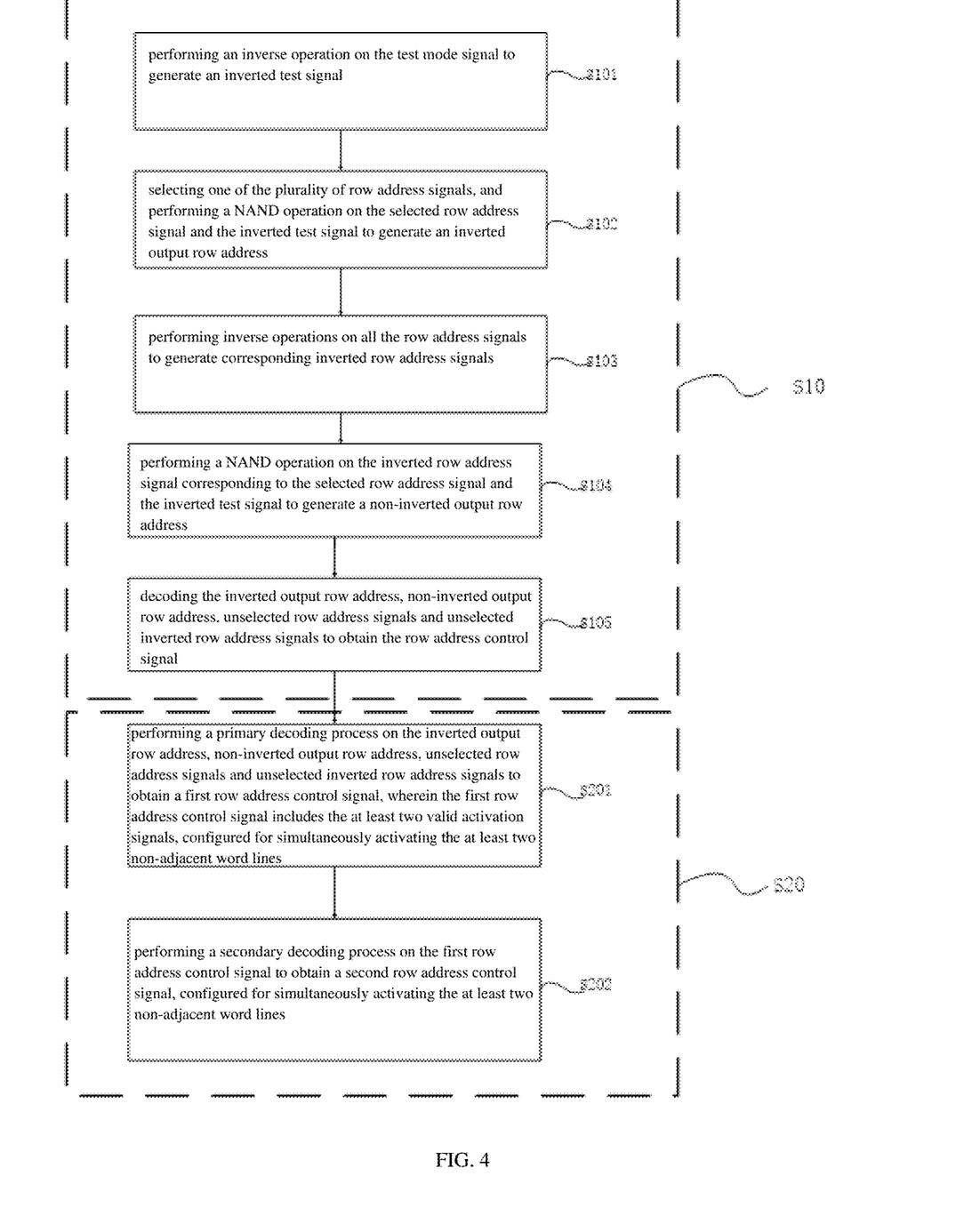
FIG. 4 is a schematic flowchart of another word line control method in accordance with one embodiment of the present invention.

In some embodiments, referring to FIG. 4, the row address input signal may include a plurality of row address signals. The step of performing logical and decoding operations on the row address input signal and the test mode signal to generate a row address control signal may include the following steps.

In step S101, an inverse operation may be performed on the test mode signal to generate an inverted test signal.

In step S102, one of the plurality of row address signals may be selected, and a NAND operation may be performed on the selected row address signal and on the inverted test signal to generate an inverted output row address.

In step S103, inverse operations may be performed on all the row address signals to generate corresponding inverted row address signals.

In step S104, a NAND operation may be performed on the inverted row address signal corresponding to the selected row address signal and on the inverted test signal to generate a non-inverted output row address.

In step S105, the inverted output row address, the non-inverted output row address, unselected row address signals and unselected inverted row address signals may be decoded to obtain the row address control signal.

Figure 6:
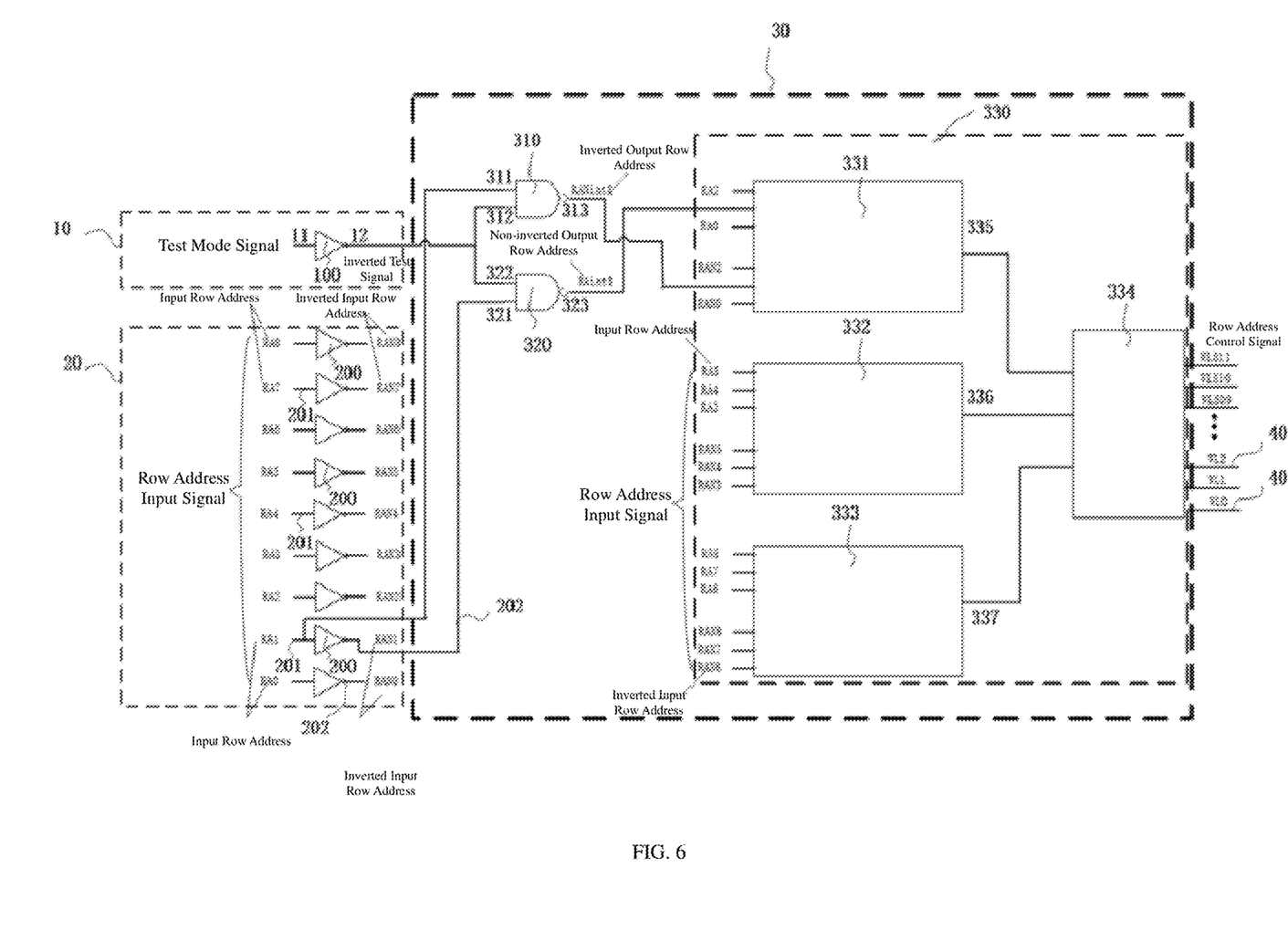
FIG. 6 is a schematic diagram showing a structure of another word line control circuit device in accordance with one embodiment of the present invention.

In some embodiments, referring to FIG. 6, the test mode signal may be set to logic status "1" to activate the test mode, when an inverse operation may be performed on the test mode signal to generate the inverted test signal. The row address input signal RA<8:0> may include nine row address signals indicated as RA0-RA8. Inverse operations may be performed on all row address signals to generate the inverted row address signals, indicated as RAN0-RAN8. A NAND operation may be performed on the row address signal randomly selected from RA0-RA8, for example, RA1, and the inverted test signal to generate the inverted output row address RANint1. Another NAND operation may be performed on the inverted row address signal RAN1 corresponding to the selected row address signal RA1 and the inverted test signal to generate the non-inverted output row address RAint1. RANint1, Raint1, RA0, RA2-RA8, RAN0 and RAN2-RAN8 may be input to the decoders to generate the row address control signal including the same number of signals as the amount of the word lines under control, such as 512 word lines. The row address control signal may include at least two valid activation signals, configured for simultaneously activating at least two random non-adjacent word lines out of the 512 word lines.

In some embodiments, referring to FIG. 4, the step of decoding the inverted output row address, non-inverted output row address, unselected row address signals and unselected inverted row address signals to obtain the row address control signal may include the following steps.

In step S201, a primary decoding process may be performed on the inverted output row address, the non-inverted output row address, the unselected row address signals and the unselected inverted row address signals to obtain a first row address control signal. The first row address control signal may include the at least two valid activation signals, configured for simultaneously activating the at least two non-adjacent word lines.

In step S202, a secondary decoding process may be performed on the first row address control signal to obtain a second row address control signal, configured for simultaneously activating the at least two non-adjacent word lines.

In some embodiments, referring to FIG. 6, the primary decoding process may be carried out by three 3-to-8 decoders. RANint1 and RAint1 may be input to one of the 3-to-8 decoders to generate first control signals including at least two valid activation signals, configured for simultaneously activating at least two non-adjacent word lines. The other two 3-to-8 decoders may be input RA0, RA2-RA8, RAN0 and RAN2-RAN8, and output second control signals and third control signals. The first control signals, second control signals and third control signals may constitute the first row address control signal.

Apparently, in addition to that described in the above example, the primary decoding process may be alternatively accomplished in other suitable manners, as long as the above effects can be achieved, without departing from the scope of the present invention.

Embodiment 2

Figure 5:
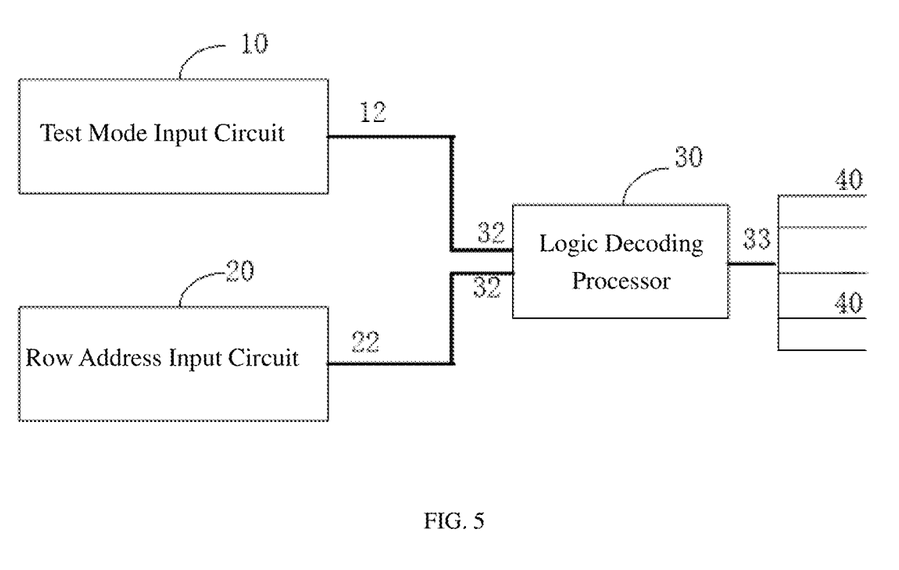
FIG. 5 is a schematic diagram showing a structure of a word line control circuit device in accordance with one embodiment of the present invention.

Referring to FIG. 5, another embodiment of the present invention provides a word line control circuit device. The word line control circuit device may include a test mode input circuit 10, a row address input circuit 20 and a logic decoding processor 30. A test mode output 12 of the test mode input circuit 10, and an output of row address input circuit 22 may be coupled to a signal input 32 of the logic decoding processor 30. A signal output 33 of the logic decoding processor 30 may be coupled to a plurality of word lines 40 in a memory array. The test mode input circuit 10 may be configured to receive a test mode signal. The row address input circuit 20 may be configured to receive a plurality of row address signals. And the logic decoding processor 30 may be configured to perform logical and decoding operations on the plurality of row address signals and test mode signal to generate a row address control signal. The row address control signal may include at least two valid activation signals, configured for simultaneously activating at least two non-adjacent word lines 40.

In some embodiments, referring to FIG. 6, the test mode input circuit 10 may include a test mode input 11, a first inverter 100 and the test mode output 12. The test mode input 11 may be configured to receive the test mode signal. The first inverter 100 may be configured to perform an inversion operation on the test mode signal to generate an inverted test signal. And the test mode output 12 may be configured to output the inverted test signal.

In some embodiments, the row address input circuit 20 may include a plurality of row address signal lines 201, and a plurality of second inverters 200 coupled to the row address signal lines 201, respectively. The row address signal lines 201 may be configured to receive the corresponding one of the row address signals from the row address input signal, respectively. And the second inverters 200 may be configured to perform inverse operations on the row address signals to generate a plurality of inverted row address signals.

In some embodiments, referring to FIG. 6, the row address input circuit 20 may include nine row address signal lines 201, each of which may be configured to receive a corresponding one of the row address input signal RA0-RA8. The nine row address signal lines 201 may be coupled to nine second inverters 200, respectively. The outputs 202 of the nine second inverters 200 may be configured to output the inverted row address signals RAN0-RAN8. Apparently, the number of row address signal lines 201 in the row address input circuit 20 is not limited to that described herein and may be modified depending on the number of row addresses to be input, without departing from the scope of the present invention.

In some embodiments, the logic decoding processor 30 may include a first NAND gate 310, a second NAND gate 320 and a decoding device 330.

The first NAND gate 310 may be configured to perform a NAND operation on a selected one of the row address signals and the inverted test signal to generate an inverted output row address. The first NAND gate 310 may include a first input 311, a second input 312 and a first output 313. The first input 311 may be coupled to a selected one of the row address signal lines 201, the second input 312 may be coupled to the test mode output 12 and configured to receive the inverted test signal, and the first output 313 may be coupled to the decoding device 330.

The second NAND gate may be configured to perform a NAND operation on one of the inverted row address signals corresponding to the selected row address signal and the inverted test signal to generate a non-inverted output row address. The second NAND gate 320 may include a third input 321, a fourth input 322 and a second output 323. The third input 321 may be coupled to the output 202 of one of the second inverters 200 corresponding to the selected row address signal line 201, the fourth input 322 may be coupled to the test mode output 12, and the second output 323 may be coupled to the decoding device 330.

The decoding device 330 may be configured to decode the inverted output row address, non-inverted output row address, unselected row address signals and unselected inverted row address signals to obtain the row address control signal. The row address control signal may include the at least two valid activation signals, configured for simultaneously activating the at least two non-adjacent word lines. The decoding device 30 may have: a decoding input coupled to the first output 313, the second output 323, the unselected row address signal lines 201 and the outputs 202 of the unselected second inverters; and a decoding output coupled to the word lines 40.

The first NAND gate 310 may perform a NAND operation on the inverted test signal and the selected row address signal RA1 and output the inverted output row address RANint1. The second NAND gate 320 may perform a NAND operation on the inverted row address signal RAN1 corresponding to the selected row address signal RA1 and the inverted test signal to generate the non-inverted output row address RAint1.

In some embodiments, the decoding device 30 may include a first decoder 331 having a set of non-inverted inputs and a set of inverted inputs. The first output 313 may be coupled to a corresponding one of the inverted inputs and the second output 323 may be coupled to a corresponding one of the non-inverted inputs. The decoding device 330 may further include a second decoder 332 and a third decoder 333. The second decoder 332 may have a set of non-inverted inputs for receiving the row address signals and a set of inverted inputs for receiving the inverted row address signals. The third decoder 333 may have a set of non-inverted inputs for receiving the row address signals and a set of inverted inputs for receiving the inverted row address signals.

Specifically, the first decoder 331 may have three non-inverted inputs RA0, RA1, RA2, and three inverted inputs RAN0, RAN1, RAN2. The inputs RA0 and RA2 may be coupled to the row address signal lines 201 in the row address input circuit 20 for receiving the row address signals RA0 and RA2, respectively. The inputs RAN0, RAN2 may be coupled to the outputs 202 of the second inverters in the row address input circuit 20 for outputting RAN0 and RAN2, respectively. Additionally, the input RA1 of the first decoder 331 may be coupled to the second output 323 of the second NAND gate 320 from which the non-inverted output row address RAint1 is output, and the input RAN1 of the first decoder 331 may be couple to the first output 313 of the first NAND gate 310 from which the inverted output row address RANint1 is output.

The second decoder 332 may include three non-inverted inputs RA3, RA4, RA5 and three inverted inputs RAN3, RAN4, RAN5. The inputs RA3, RA4, RA5 may be coupled to the three row address signal lines 201 in the row address input circuit 20 for receiving the row address signals RA3, RA4, RA5, respectively. And the inputs RAN3, RAN4, RAN5 may be coupled to the outputs 202 of the three second inverters in the row address input circuit 20 for outputting RAN3, RAN4 and RAN5, respectively.

The third decoder 333 may include three non-inverted inputs RA6, RA7, RA8 and three inverted inputs RAN6, RAN7, RAN8. The inputs RA6, RA7, RA8 may be coupled to the three row address signal lines 201 in the row address input circuit 20 for receiving the row address signal RA6, RA7, RA8, respectively. And the inputs RAN6, RAN7, RAN8 may be coupled to the outputs 202 of the three second inverters in the row address input circuit 20 for outputting RAN6, RAN7 and RAN8, respectively.

The decoding device 30 may further include a fourth decoder 334. The fourth decoder 334 may have inputs coupled to output of the first decoder 335, output of the second decoder 336, and output of the third decoder 337. The input of the first decoder 331, input of the second decoder 332, and input of the third decoder 333 may constitute the signal input 32 of the logic decoding processor 30. The fourth decoder 334 may have outputs constituting the signal output 33 of the logic decoding processor 30 that is coupled to the word lines 40. The fourth decoder 334 may be configured to output a second row address control signal for activating/deactivating the respective word lines, and simultaneously activating the at least two non-adjacent word lines 40 based on the aforementioned at least two valid activation signals.

Referring to FIG. 6, the memory array may include 516 word lines 40, indicated as WL0-WL512. The number of the word lines 40 may vary within an appropriate range, depending on actual needs, without departing from the scope of the present invention.

Embodiment 3

The present invention also provides a semiconductor memory. The semiconductor memory may include the word line control circuit devices as defined above.

Described above are merely a few specific embodiments of the present invention, the scope of which is, however, not limited to these embodiments disclosed herein and is intended to embrace all changes and substitutions easily conceivable by those of ordinary skill in the art based on the present disclosure. Therefore, the scope of the present invention shall be defined by the appended claims.

The invention claimed is:

1. A word line control method for a word line control circuit device, wherein the word line control circuit device comprises a test mode input circuit, a row address input circuit, and a logic decoding processor, wherein the test mode input circuit comprises a first inverter, wherein the row address input circuit comprises a second inverter, wherein the logic decoding processor comprises a first NAND gate, a second NAND gate, and a decoding device, and wherein the word line control method comprising:

acquiring a row address input signal by the row address input circuit;

acquiring a test mode signal by the test mode input circuit;

performing logical and decoding operations on the row address input signal and the test mode signal by the logic decoding processor to generate a row address control signal, wherein the row address control signal includes at least two valid activation signals; and simultaneously activating at least two non-adjacent word lines by the logic decoding processor based on the at least two valid activation signals, wherein the row address input signal includes a plurality of row address signals, and wherein performing logical and decoding operations on the row address input signal and the test mode signal to generate a row address control signal comprises:

performing an inverse operation by the first inverter on the test mode signal to generate an inverted test signal;

selecting one of the plurality of row address signals, and performing a NAND operation on the selected row address signal and the inverted test signal by the first NAND gate to generate an inverted output row address;

performing inverse operations by the second inverter on all the row address signals to generate corresponding inverted row address signals;

performing a NAND operation on the inverted row address signal corresponding to the selected row address signal and the inverted test signal by the second NAND gate to generate a non-inverted output row address; and decoding the inverted output row address, the non-inverted output row address, unselected row address signals and unselected inverted row address signals by the decoding device to obtain the row address control signal.

2. The method of claim 1, wherein decoding the inverted output row address, the non-inverted output row address, unselected row address signals and unselected inverted row address signals to obtain the row address control signal comprises:

performing a primary decoding process on the inverted output row address, the non-inverted output row address, the unselected row address signals and the unselected inverted row address signals to obtain a first row address control signal, wherein the first row address control signal includes the at least two valid activation signals, configured for simultaneously activating the at least two non-adjacent word lines; and performing a secondary decoding process on the first row address control signal to obtain a second row address control signal, configured for simultaneously activating the at least two non-adjacent word lines.

3. A word line control circuit device, comprising:

a test mode input circuit, configured to receive a test mode signal;

a row address input circuit, configured to receive a plurality of row address signals; and a logic decoding processor, configured to perform logical and decoding operations on the plurality of row address signals and the test mode signal to generate a row address control signal, wherein the row address control signal includes at least two valid activation signals, configured for simultaneously activating at least two non-adjacent word lines, wherein the test mode input circuit has an output coupled, together with an output of the row address input circuit, to a signal input of the logic decoding processor, wherein the logic decoding processor has a signal output coupled to a plurality of word lines in a memory array, wherein the test mode input circuit comprises:

a test mode input, configured to receive the test mode signal;

a first inverter, configured to perform an inverse operation on the test mode signal to generate an inverted test signal; and a test mode output, configured to output the inverted test signal, wherein the row address input circuit comprises:
a plurality of row address signal lines, configured to receive the corresponding one of the row address signals from the row address input signal, respectively; and
a plurality of second inverters coupled to the corresponding one of the row address signal lines, respectively, and configured to perform inverse operations on the row address signals to generate a plurality of inverted row address signals,
and wherein the logic decoding processor comprises:
a first NAND gate, configured to perform a NAND operation on the selected one of the row address signals and the inverted test signal to generate an inverted output row address;
a second NAND gate, configured to perform a NAND operation on one of the inverted row address signals corresponding to the selected row address signal and the inverted test signal to generate a non-inverted output row address; and
a decoding device, configured to decode the inverted output row address, the non-inverted output row address, unselected row address signals and unselected inverted row address signals to obtain the row address control signal,
wherein the first NAND gate includes a first input coupled to the one of the row address signal lines corresponding to the selected row address signal, a second input coupled to the test mode output and configured to receive the inverted test signal, and a first output,
and wherein the second NAND gate includes a third input coupled to an output of one of the second inverters corresponding to the selected row address signal, a fourth input coupled to the test mode output, and a second output.

4. The device of claim 1, wherein the decoding device comprises a first decoder, wherein the first decoder has a set of non-inverted inputs and a set of inverted inputs, and wherein the first output is coupled to the corresponding one of the inverted inputs and the second output is coupled to the corresponding one of the non-inverted inputs.

5. The device of claim 4, wherein the decoding device further comprises a second decoder and a third decoder,
wherein the second decoder has a set of non-inverted inputs configured for receiving the unselected row address signals, and a set of inverted inputs configured for receiving the unselected inverted row address signals,
and wherein the third decoder has a set of non-inverted inputs configured for receiving the unselected row address signals, and a set of inverted inputs configured for receiving the unselected inverted row address signals.

6. The device of claim 5, wherein the decoding device further comprises a fourth decoder,
wherein the fourth decoder has inputs coupled to the outputs of the first decoder, the second decoder and the third decoder,
wherein the inputs of the first decoder, the second decoder and the third decoder constitute the signal input of the logic decoding processor,
and wherein the fourth decoder has outputs constituting the signal output of the logic decoding processor that is coupled to the word lines.

7. A semiconductor memory comprising a word line control circuit device, wherein the word line control circuit device comprises:
a test mode input circuit, configured to receive a test mode signal;
a row address input circuit, configured to receive a plurality of row address signals; and
a logic decoding processor, configured to perform logical and decoding operations on the plurality of row address signals and the test mode signal to generate a row address control signal, wherein the row address control signal includes at least two valid activation signals, configured for simultaneously activating at least two non-adjacent word lines,
wherein the test mode input circuit has an output coupled, together with an output of the row address input circuit, to a signal input of the logic decoding processor,
wherein the logic decoding processor has a signal output coupled to a plurality of word lines in a memory array,
wherein the test mode input circuit comprises:
a test mode input, configured to receive the test mode signal;
a first inverter, configured to perform an inverse operation on the test mode signal to generate an inverted test signal; and
a test mode output, configured to output the inverted test signal,
wherein the row address input circuit comprises:
a plurality of row address signal lines, configured to receive the corresponding one of the row address signals from the row address input signal, respectively; and
a plurality of second inverters coupled to the corresponding one of the row address signal lines, respectively, and configured to perform inverse operations on the row address signals to generate a plurality of inverted row address signals,
and wherein the logic decoding processor comprises:
a first NAND gate, configured to perform a NAND operation on the selected one of the row address signals and the inverted test signal to generate an inverted output row address;
a second NAND gate, configured to perform a NAND operation on one of the inverted row address signals corresponding to the selected row address signal and the inverted test signal to generate a non-inverted output row address; and
a decoding device, configured to decode the inverted output row address, the non-inverted output row address, unselected row address signals and unselected inverted row address signals to obtain the row address control signal, wherein the row address control signal includes the at least two valid activation signals,
wherein the first NAND gate includes a first input coupled to the one of the row address signal lines corresponding to the selected row address signal, a second input coupled to the test mode output and configured to receive the inverted test signal, and a first output,
and wherein the second NAND gate includes a third input coupled to an output of one of the second inverters corresponding to the selected row address signal, a fourth input coupled to the test mode output, and a second output.

8. The semiconductor memory of claim 7, wherein in the word line control circuit device, the decoding device comprises a first decoder, wherein the first decoder has a set of non-inverted inputs and a set of inverted inputs, and wherein the first output is coupled to the corresponding one of the inverted inputs and the second output is coupled to the corresponding one of the non-inverted inputs.

9. The semiconductor memory of claim 8, wherein in the word line control circuit device, the decoding device further comprises a second decoder and a third decoder,
- wherein the second decoder has a set of non-inverted inputs configured for receiving the unselected row address signals, and a set of inverted inputs configured for receiving the unselected inverted row address signals,
- and wherein the third decoder has a set of non-inverted inputs configured for receiving the unselected row address signals, and a set of inverted inputs configured for receiving the unselected inverted row address signals.

10. The semiconductor memory of claim 9, wherein in the word line control circuit device, the decoding device further comprises a fourth decoder,
- wherein the fourth decoder has inputs coupled to the outputs of the first decoder, the second decoder and the third decoder,
- wherein the inputs of the first decoder, the second decoder and the third decoder constitute the signal input of the logic decoding processor,
- and wherein the fourth decoder has outputs constituting the signal output of the logic decoding processor that is coupled to the word lines.

\* \* \* \* \*